(12) United States Patent
Lee et al.

(10) Patent No.: US 10,132,630 B2
(45) Date of Patent: Nov. 20, 2018

(54) MULTI-AXIS INTEGRATED MEMS INERTIAL SENSING DEVICE ON SINGLE PACKAGED CHIP

(71) Applicant: mCube Inc., San Jose, CA (US)

(72) Inventors: Terrence Lee, San Jose, CA (US); Wenhua Zhang, San Jose, CA (US); Sudheer Sridharamurthy, San Jose, CA (US); Shingo Yoneoka, San Jose, CA (US)

(73) Assignee: mCube Inc., San Jose, CA (US)

( * ) Notice: Subject to any disclaimer, the term of this patent is extended or adjusted under 35 U.S.C. 154(b) by 187 days.

(21) Appl. No.: 14/162,718

(22) Filed: Jan. 23, 2014

(65) Prior Publication Data

US 2014/0311242 A1    Oct. 23, 2014

Related U.S. Application Data

(60) Provisional application No. 61/757,088, filed on Jan. 25, 2013, provisional application No. 61/757,085, filed on Jan. 25, 2013.

(51) Int. Cl.
*G01C 19/5783* (2012.01)
*G01C 19/56* (2012.01)
(Continued)

(52) U.S. Cl.
CPC ............ *G01C 19/56* (2013.01); *B81B 7/0038* (2013.01); *G01C 19/5783* (2013.01);
(Continued)

(58) Field of Classification Search
CPC .... G01P 15/02; G01P 15/18; G01P 2015/088; G01P 2015/0848; G01P 2015/0871;
(Continued)

(56) References Cited

U.S. PATENT DOCUMENTS 6,134,961 A * 10/2000 Touge ................ G01C 19/5719
73/504.04
8,156,806 B1 * 4/2012 Cardarelli .......... G01C 19/5776
73/504.04
(Continued)

FOREIGN PATENT DOCUMENTS

CN          102854998 A      1/2013
EP          2135840 A2      12/2009
(Continued)

OTHER PUBLICATIONS

Search Report for European patent application EP14171673.8 (dated Nov. 10, 2014), 8 pages.
(Continued)

*Primary Examiner* — Daniel S Larkin
*Assistant Examiner* — David L Singer
(74) *Attorney, Agent, or Firm* — Kilpatrick Townsend & Stockton LLP

(57) ABSTRACT

A multi-axis integrated MEMS inertial sensor device. The device can include an integrated 3-axis gyroscope and 3-axis accelerometer on a single chip, creating a 6-axis inertial sensor device. The structure is spatially configured with efficient use of the design area of the chip by adding the accelerometer device to the center of the gyroscope device. The design architecture can be a rectangular or square shape in geometry, which makes use of the whole chip area and maximizes the sensor size in a defined area. The MEMS is centered in the package, which is beneficial to the sensor's temperature performance. Furthermore, the electrical bonding pads of the integrated multi-axis inertial sensor device can be configured in the four corners of the rectangular chip layout. This configuration guarantees design symmetry and efficient use of the chip area.

16 Claims, 2 Drawing Sheets

(51) Int. Cl.
*G01P 1/00* (2006.01)
*B81B 7/00* (2006.01)
*G01P 15/18* (2013.01)
*G01P 15/02* (2013.01)
*G01P 15/08* (2006.01)

(52) U.S. Cl.
CPC .............. *G01P 1/003* (2013.01); *G01P 15/02* (2013.01); *G01P 15/18* (2013.01); *B81B 2201/0235* (2013.01); *B81B 2201/0242* (2013.01); *G01P 2015/088* (2013.01); *G01P 2015/0871* (2013.01)

(58) Field of Classification Search
CPC ........ G01P 15/14; G01P 15/097; G01P 1/003; G01C 19/56; G01C 19/5783; G01C 19/5719; G01C 19/5733; G01C 19/5755; G01C 19/5769; B81B 2201/0235; B81B 2201/0242; B81B 2201/0228; B81B 2201/025; B81B 7/0035; B81B 7/0038; B81B 7/0041; B81C 1/00246; B81C 2203/0757; B81C 2203/0778
USPC ... 73/504.12, 504.04, 510–512, 504.03, 493, 73/526
See application file for complete search history.

(56) References Cited

U.S. PATENT DOCUMENTS

| | | | |
|---|---|---|---|
| 8,164,171 | B2 | 4/2012 | Lin et al. |
| 8,171,792 | B2* | 5/2012 | Sameshima ............ G01C 19/56 73/504.04 |
| 8,205,498 | B2 | 6/2012 | Hsu et al. |
| 8,516,886 | B2 | 8/2013 | Acar et al. |
| 8,878,312 | B2 | 11/2014 | Hung et al. |
| 9,249,012 | B2 | 2/2016 | Lee et al. |
| 2003/0110858 | A1* | 6/2003 | Kim ................... G01C 19/5762 73/504.02 |
| 2003/0196490 | A1 | 10/2003 | Cardarelli |
| 2003/0216884 | A1* | 11/2003 | Cardarelli .......... G01C 19/5719 702/145 |
| 2004/0121564 | A1 | 6/2004 | Gogoi |
| 2004/0231420 | A1* | 11/2004 | Xie ........................ B81B 3/0062 73/514.32 |
| 2007/0029629 | A1* | 2/2007 | Yazdi .................. B81C 1/00253 257/414 |
| 2007/0164378 | A1* | 7/2007 | MacGugan ........... B81C 1/0023 257/416 |
| 2008/0028855 | A1 | 2/2008 | Kano et al. |
| 2008/0115579 | A1* | 5/2008 | Seeger ............... G01C 19/5712 73/504.12 |
| 2008/0163687 | A1* | 7/2008 | Kranz ................. B81C 1/00246 73/514.32 |
| 2008/0314147 | A1* | 12/2008 | Nasiri ................... G01P 15/125 73/514.32 |
| 2009/0064781 | A1 | 3/2009 | Ayazi et al. |
| 2009/0114016 | A1* | 5/2009 | Nasiri ................. G01C 19/5719 73/504.12 |
| 2009/0126490 | A1* | 5/2009 | Sameshima ............ G01C 19/56 73/514.32 |
| 2009/0280594 | A1* | 11/2009 | Mehregany ......... B81C 1/00182 438/50 |
| 2009/0309203 | A1 | 12/2009 | Seppala et al. |
| 2010/0071467 | A1 | 3/2010 | Nasiri et al. |
| 2010/0089153 | A1* | 4/2010 | Zhang .................... G01D 11/10 73/431 |
| 2010/0281977 | A1* | 11/2010 | Coronato ........... G01C 19/5712 73/504.14 |
| 2011/0030473 | A1 | 2/2011 | Acar |
| 2011/0031565 | A1 | 2/2011 | Marx et al. |
| 2011/0121416 | A1 | 5/2011 | Quevy et al. |
| 2011/0265565 | A1* | 11/2011 | Acar .................... G01C 19/5712 73/504.08 |
| 2011/0265574 | A1 | 11/2011 | Yang |
| 2012/0012970 | A1 | 1/2012 | Xu et al. |
| 2012/0061172 | A1* | 3/2012 | Yacine ............... G01C 19/5747 181/121 |
| 2012/0223726 | A1 | 9/2012 | Zhang et al. |
| 2012/0326248 | A1 | 12/2012 | Daneman et al. |
| 2013/0042686 | A1 | 2/2013 | Lin et al. |
| 2013/0247662 | A1 | 9/2013 | Jin et al. |
| 2013/0247666 | A1 | 9/2013 | Acar |
| 2013/0328139 | A1 | 12/2013 | Acar |
| 2014/0311247 | A1 | 10/2014 | Zhang et al. |
| 2015/0000400 | A1 | 1/2015 | Cazzaniga |
| 2015/0111332 | A1 | 4/2015 | Lee |

FOREIGN PATENT DOCUMENTS

| | | |
|---|---|---|
| EP | 2339293 B1 | 11/2013 |
| TW | 201020548 A | 6/2010 |
| TW | 201110274 A | 3/2011 |
| TW | 201117349 A | 5/2011 |
| TW | 201213764 A | 4/2012 |
| TW | 201229516 A | 7/2012 |
| TW | 201238032 A | 9/2012 |
| WO | WO2010092399 A2 | 8/2010 |
| WO | 2012/037539 A1 | 3/2012 |

OTHER PUBLICATIONS

Sun Sensing and control electronics design for capacitive CMOS-MEMS inertial sensors, PhD. Dissertation University of Florida (copyright 2002), sections 2.2.4, 7.3, chapters 3 and 6.
Xie "Gyroscope and Micromirror Design Using Vertical Axis CMOS-MEMS Actuation and Sensing," PhD. Dissertation Carnegie Institute of Technology (copyright 2002), sections 3.2, 5.3.2.2, 6.2.8, chapter 6.
Search Report and Written Opinion for European patent application EP14152747 (dated Sep. 3, 2014), 11 pages.
Office Action issued by the Taiwan Patent Office for patent application TW102108387 (dated Feb. 17, 2015).
European Patent Application No. 14152747.3, "Office Action" dated Mar. 4, 2016, 6 pages.
U.S. Appl. No. 14/163,789, Non-final Office Action dated Mar. 31, 2016, 19 pages.
European Patent Application No. 14152747.3, "Office Action" dated Dec. 22, 2016, 5 pages.
Communication Pursuant to Article 94(3) EPC received in European Patent Application No. 14 157 747.3, dated Mar. 4, 2016. 6 pages.
Communication Pursuant to Article 94(3) EPC received in European Patent Application No. 14 157 747.3, dated Jan. 26, 2018. 6 pages.
Final Office Action received in U.S. Appl. No. 14/163,789, dated Aug. 11, 2016. 22 pages.
Final Office Action received in U.S. Appl. No. 14/163,789, dated Jun. 7, 2017. 21 pages.
Non-Final Office Action received in U.S. Appl. No. 14/521,441, dated Apr. 28, 2015. 9 pages.
Non-Final Office Action received in U.S. Appl. No. 14/163,789, dated Dec. 27, 2016. 17 pages.
Notice of Allowance received in U.S. Appl. No. 14/521,441, dated Sep. 21, 2015. 7 pages.
Notice of Allowance received in U.S. Appl. No. 14/163,789, dated Dec. 20, 2017. 9 pages.
Restriction Requirement received in U.S. Appl. No. 14/521,441, dated Jan. 28, 2015. 5 pages.
Tatar, E. et al. *Quadrature-Error Compensation and Corresponding Effects on the Performance of Fully Decoupled MEMO Gyroscopes.* Journal of Microelectromechanical Systems, vol. 21, No. 3. Published Jun. 2012. pp. 656-667.

* cited by examiner

MULTI-AXIS INTEGRATED MEMS INERTIAL SENSING DEVICE ON SINGLE PACKAGED CHIP

CROSS-REFERENCES TO RELATED APPLICATIONS

The present application claims priority to and incorporates by reference, for all purposes, the following patent applications: U.S. Provisional App. 61/757,085, filed Jan. 25, 2013, and U.S. Provisional App. 61/757,088, filed Jan. 25, 2013.

BACKGROUND OF THE INVENTION

The present invention is directed to MEMS (Micro-Electro-Mechanical-Systems). More specifically, embodiments of the invention provide methods and structure for improving integrated MEMS devices, including inertial sensors and the like. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much broader range of applicability.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving operation of integrated circuit devices and MEMS are highly desired.

BRIEF SUMMARY OF THE INVENTION

The present invention is directed to MEMS (Micro-Electro-Mechanical-Systems). More specifically, embodiments of the invention provide methods and structure for improving integrated MEMS devices, including inertial sensors and the like. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much broader range of applicability.

In an embodiment, the present invention provides a structure of a multi-axis integrated MEMS inertial sensor device. The device can include an integrated 3-axis gyroscope and 3-axis accelerometer on a single chip, creating a 6-axis inertial sensor device. The structure is spatially configured with efficient use of the design area of the chip by adding the accelerometer device to the center of the gyroscope device. In a specific embodiment, the design architecture can be a rectangular or square shape in geometry, which makes use of the whole chip area and maximizes the sensor size in a defined area. The MEMS is centered in the package, which is beneficial to the sensor's temperature performance. Furthermore, the electrical bonding pads of the integrated multi-axis inertial sensor device can be configured in the four corners of the rectangular chip layout. This configuration guarantees design symmetry and efficient use of the chip area.

In a specific embodiment, all portions of the gyroscope structure can be formed from a single mask layer and configured with a hollow middle portion. This single layer can incorporate each of the sensed gyro motions. X, Y, and Z axis sensors of the integrated gyroscope do not need to be formed separately, which reduces the number of steps in fabrication.

An optional design involves using a Z travel stop structure in a cap wafer to adjust damping performance in the central area of the chip, where the accelerometer device is disposed. This configuration can be used to mitigate a phenomenon called "accelerometer ringing", which can be undesirable for various applications. Certain closed-loop feedback systems might be needed to control sensor ringing. By using the Z travel stop structure, the present design can alleviate "Accel ringing" during operation and allow a low damping gyroscope and a high damping accelerometer to coexist within a single package.

Various additional objects, features and advantages of the present invention can be more fully appreciated with reference to the detailed description and accompanying drawings that follow.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

The present invention is directed to MEMS (Micro-Electro-Mechanical-Systems). More specifically, embodiments of the invention provide methods and structures for improving integrated MEMS devices, including inertial sensors and the like. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much broader range of applicability.

Figure 1:
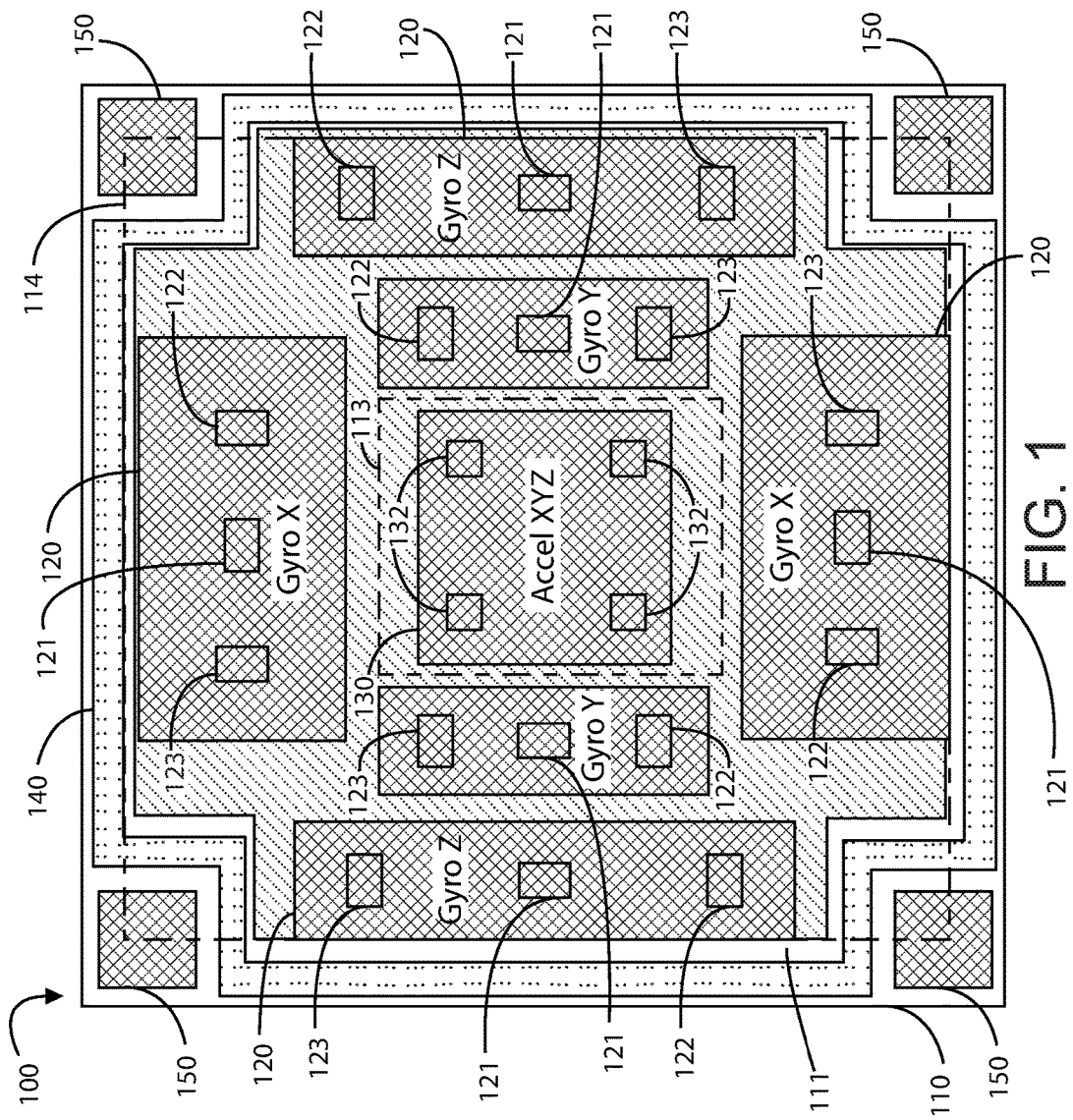
FIG. 1 is a simplified schematic diagram illustrating a multi-axis integrated MEMS inertial sensing device according to an embodiment of the present invention.
Figure 2:
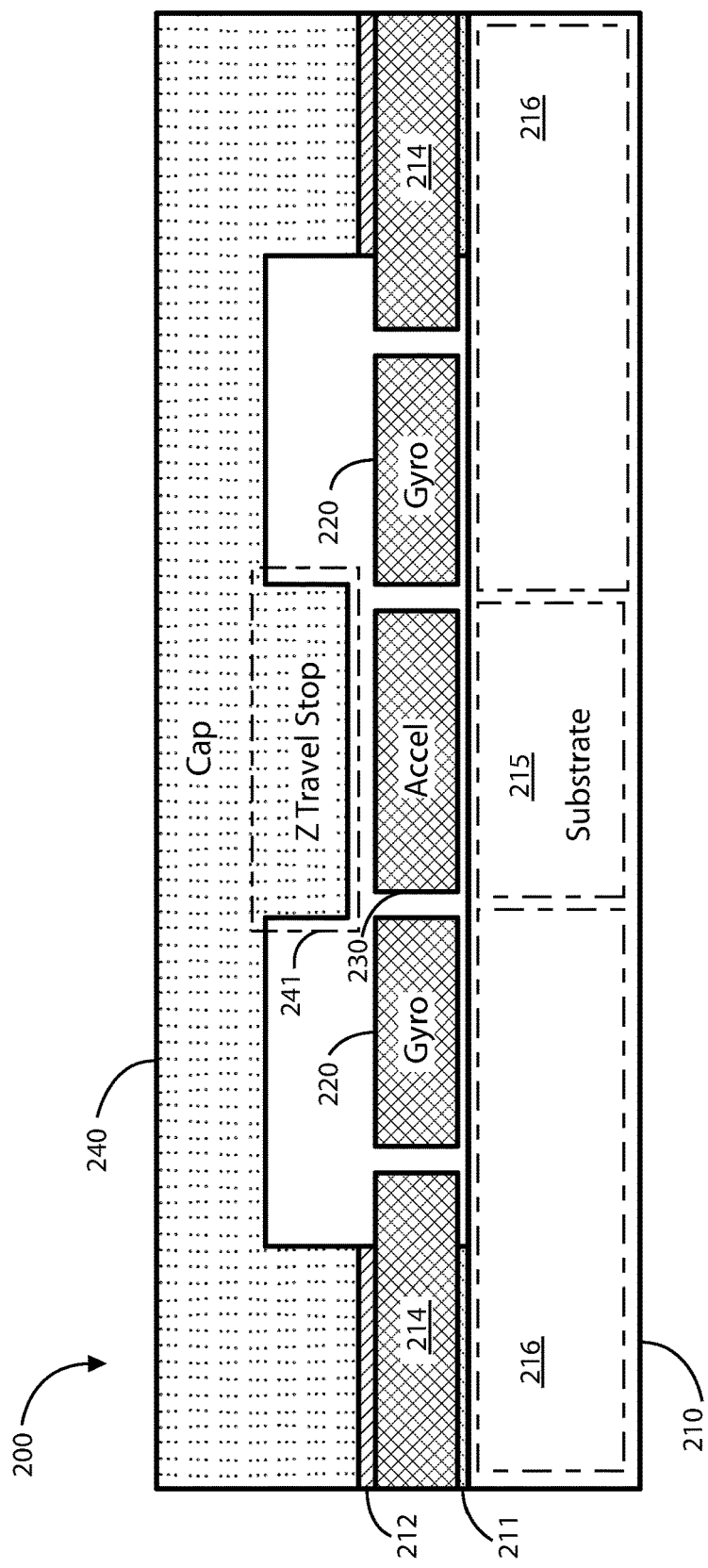
FIG. 2 is a simplified cross-sectional diagram illustrating a multi-axis integrated MEMS inertial sensing device according to an embodiment of the present invention.

FIG. 1 is a simplified schematic diagram and FIG. 2 is a simplified cross-sectional diagram, both of which illustrate a multi-axis integrated MEMS inertial sensing device and according to an embodiment of the present invention.

As shown in FIG. 1, device 100 uses an architecture that allows a 3-axis gyroscope 120 and a 3-axis accelerometer 130 to be built in the same chip 111 overlying substrate 110 and in the same package cavity formed by a cap wafer 140 and substrate 110. The gyroscope 120 is located outside of the chip or in an outside portion of the chip, while the accelerometer 130 is in the central area of the chip with anchors 132. In an embodiment, a first MEMS inertial sensor 130, which can be an accelerometer, and a second MEMS inertial sensor 120, which can be a gyroscope, can be configured on a substrate 110 having an inner surface region 113 and an outer surface region 114. The first MEMS inertial sensor 130 can be configured on the inner surface region, while the second MEMS inertial sensor 120 can be configured on the outer surface region. Other combinations of MEMS, sensors, and the like, can be used as well.

In a specific embodiment, a first MEMS inertial sensor 130 and a second MEMS inertial sensor 120 are configured overlying a fully processed CMOS substrate 110. The first inertial sensor 130 can be configured in an inner portion of the CMOS surface region 113, and the second inertial sensor 120 can be configured in an outer portion of the CMOS surface region 114. Both sensors will be capped in the same vacuum cavity and there is no hermetic sealing in between. In a specific embodiment, there can be hermetic sealing between the inner and output portion. Thus, both inertial sensors can be configured on the same chip and within the same package.

In a specific embodiment, the gyroscope 120 can include anchors 121, which are coupled to the semiconductor substrate 110. Each of the elements 120 can be a proof mass for a designated sensing axis (X, Y, and Z) as denoted in FIG. 1. Also, each of these elements 120 can include corresponding displacement sensors 122 for each sensing axis. Furthermore, each of gyro elements 120 can include a displacement driver 123 configured to displace the proof mass. The x-axis, y-axis, and z-axis displacement sensors 122 provide data in response to the displacement of the proof mass 120 by the displacement driver 123.

In an embodiment, bond pads can be configured in one or more of the corners of the die, substrate, or package. In a specific embodiment, all four corners have dedicated area for electrical bonding pads 150. There is no additional top/bottom, or left/right area to be allocated to bonding pads. This architecture can maximize the sensor area, and hence achieve better performance. The sensors are all symmetric in geometry, which is beneficial to sensor temperature performance, due to packaging effect.

In a specific embodiment, all portions of the gyroscope structure can be formed from a single mask layer and configured with a hollow middle portion. This single layer can incorporate each of the sensed gyro motions. X, Y, and Z axis sensors of the integrated gyroscope do not need to be formed separately, which reduces the number of steps in fabrication.

FIG. 2 shows the cross-section of the multi-axis integrated inertial sensor device. As shown, device 200 includes a semiconductor substrate 210, which can have a central region 215 and a border region 216 around the central region. A three-axis accelerometer 230 can be formed within the central region of the semiconductor substrate 210 and a three-axis gyroscope 220 can be formed within the border region of the semiconductor substrate. Also, layers 211 and 212 can include passivation or dielectric layers. Blocks 214 provide support between a cap wafer 240 and semiconductor substrate 210.

An optional design involves using a Z travel stop structure 241 in cap wafer 240 to adjust damping performance in the central area of the chip 215, where the accelerometer device is disposed. As shown in FIG. 2, the "Z Travel Stop" structure is shown by the lower ceiling of the cap wafer overlying the accel portion compared to the higher ceiling overlying the gyro portion. This configuration can be used to mitigate a phenomenon called "accelerometer ringing", which can be undesirable for various applications. Certain closed-loop feedback systems might be needed to control sensor ringing. By using the Z travel stop structure, the present design can alleviate "Accel ringing" during operation and allow a low damping gyroscope and a high damping accelerometer to coexist within a single package.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A multi-axis integrated MEMS inertial sensing device, the device comprising:
   a substrate member having a surface region, the surface region has an inner portion and an outer portion, the outer portion completely surrounding the inner portion;
   at least one bond pad overlying each of four corners of the outer portion of the surface region;
   a first MEMS inertial sensor overlying the inner portion of the surface region, the first MEMS inertial sensor comprising an accelerometer, the accelerometer being disposed completely inside the inner portion of the surface region; and
   a second MEMS inertial sensor overlying the outer portion of the surface region;
   wherein the second MEMS inertial sensor comprises a 3-axis gyroscope which includes one or more pairs of one-axis gyroscope sensors, the two one-axis gyroscope sensors of each pair being configured to sense along one common direction in space and being located symmetrically at opposite sides of the accelerometer, the gyroscope being disposed completely inside the outer portion of the surface region;

wherein the 3-axis gyroscope comprises x-axis gyroscope sensors, y-axis gyroscope sensors, and z-axis gyroscope sensors;

wherein the x-axis gyroscope sensors are placed along one axis of the substrate, and y-axis gyroscope sensors and the z-axis gyroscope sensors are placed along an orthogonal axis of the substrate;

wherein the multi-axis integrated MEMS inertial sensing device further comprises a cap wafer having a Z-travel stop structure spatially configured overlying the inner portion, thereby allowing high damping to the accelerometer and low damping to the 3-axis gyroscope.

2. The multi-axis integrated MEMS inertial sensing device of claim 1 wherein the two one-axis gyroscope sensors of each pair is located symmetrically at opposite sides of the accelerometer in a symmetric rectangular geometry.

3. The multi-axis integrated MEMS inertial sensing device of claim 1 wherein the first MEMS inertial sensor includes a 3-axis accelerometer.

4. The multi-axis integrated MEMS inertial sensing device of claim 3 wherein the 3-axis accelerometer comprises a proof mass anchored to the substrate member within the inner portion.

5. The multi-axis integrated MEMS inertial sensing device of claim 1, wherein the 3-axis gyroscope is a single mask layer device.

6. The multi-axis integrated MEMS inertial sensing device of claim 5 wherein the 3-axis gyroscope comprises a proof mass anchored to the substrate member within the outer portion.

7. The multi-axis integrated MEMS inertial sensing device of claim 1 wherein each x-axis gyroscope sensor comprises a proof mass, a displacement driver, and an anchor structure, where the displacement driver and the anchor structure are disposed inside the proof mass.

8. An integrated MEMS device comprises:
a semiconductor substrate comprising a central region and a border region completely surrounding the central region;
a three-axis accelerometer formed only within the central region of the semiconductor substrate; and
a three-axis gyroscope formed only within the border region of the semiconductor substrate, wherein the three-axis accelerometer is surrounded by portions of the three-axis gyroscope along both an X-axis and a Y-axis of the substrate;
wherein the three-axis gyroscope comprises x-axis gyroscope sensors, y-axis gyroscope sensors, and z-axis gyroscope sensors;
wherein the x-axis gyroscope sensors are placed along one axis of the substrate, and y-axis gyroscope sensors and the z-axis gyroscope sensors are placed along an orthogonal axis of the substrate;
wherein each x-axis gyroscope sensor comprises a proof mass, a displacement driver, and an anchor structure, where the displacement driver and the anchor structure are disposed inside the proof mass;
wherein the integrated MEMS device further comprises a cap wafer having a Z-travel stop structure spatially configured overlying the central region, thereby allowing high damping to the three-axis accelerometer and low damping to the three-axis gyroscope.

9. The integrated MEMS device of claim 8 wherein the central region is selected from a group consisting of: rectangular, square, quadrilateral, and polygonal.

10. The integrated MEMS device of claim 8 wherein the three-axis accelerometer comprises a proof mass anchored to the semiconductor substrate within the central region.

11. The integrated MEMS device of claim 8 wherein the proof mass of the three-axis gyroscope is anchored to the semiconductor substrate within the border region.

12. The integrated MEMS device of claim 8 wherein two gyroscope sensors of each pair of gyroscope sensors for each of X, Y, and Z axes are located symmetrically at opposite sides of the three-axis accelerometer.

13. A multi-axis integrated MEMS inertial sensing device, the device comprising:
a semiconductor substrate comprising a central region and a border region around the central region;
at least one bond pad overlying each of the corners of the border region;
a three-axis accelerometer overlying the central region;
a three-axis gyroscope overlying the border region, wherein the three-axis gyroscope comprises a pair of gyroscope sensors for each of X, Y, and Z axes, the two gyroscope sensors of each pair being located symmetrically at opposite sides of the three-axis accelerometer, wherein the pair of gyroscope sensors for the X axis are placed along one axis of the substrate, and the pair of gyroscope sensors for the Y axis and the pair of gyroscope sensors for the Z axis are placed along an orthogonal axis of the substrate; and
a cap wafer having a Z-travel stop structure, the Z-travel stop structure spatially configured overlying the central region, thereby allowing high damping to the three-axis accelerometer and low damping to the three-axis gyroscope;
wherein each of the gyroscope sensors for the X, Y, and Z axes comprises a proof mass, a displacement driver, and an anchor structure, where the displacement driver and the anchor structure are disposed inside the proof mass.

14. The multi-axis integrated MEMS inertial sensing device of claim 13 wherein the three-axis accelerometer comprises a proof mass anchored to the semiconductor substrate within the central region.

15. The multi-axis integrated MEMS inertial sensing device of claim 13 wherein the three-axis gyroscope comprises a proof mass anchored to the semiconductor substrate within the border region.

16. The multi-axis integrated MEMS inertial sensing device of claim 15 wherein the three-axis gyroscope comprises x-axis displacement sensors, y-axis displacement sensors, and z-axis displacement sensors;
wherein the three-axis gyroscope comprises a displacement driver configured to displace the proof mass; and
wherein the x-axis displacement sensors, y-axis displacement sensors, and z-axis displacement sensors provide displacement data in response to displacement of the proof mass by the displacement driver.

* * * * *